United States Patent
Suzuki et al.

(10) Patent No.: US 9,401,244 B2
(45) Date of Patent: Jul. 26, 2016

(54) CONDUCTIVE PASTE, MULTILAYER CERAMIC ELECTRONIC COMPONENT, AND METHOD FOR MANUFACTURING SAME

(71) Applicant: MURATA MANUFACTURING CO., LTD., Nagaokakyo-shi, Kyoto-fu (JP)

(72) Inventors: Toshihiro Suzuki, Nagaokakyo (JP); Naoaki Ogata, Nagaokakyo (JP); Masahito Ishikawa, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 14/569,841

(22) Filed: Dec. 15, 2014

(65) Prior Publication Data

US 2015/0098165 A1    Apr. 9, 2015

Related U.S. Application Data

(63) Continuation of application No. PCT/JP2013/063861, filed on May 19, 2013.

(30) Foreign Application Priority Data

Jun. 15, 2012  (JP) .................................. 2012-135609

(51) Int. Cl.
*H01B 1/22* (2006.01)
*B05D 5/12* (2006.01)
(Continued)

(52) U.S. Cl.
CPC .. *H01G 4/30* (2013.01); *C09D 5/24* (2013.01); *C09D 11/037* (2013.01); *C09D 11/106* (2013.01); *C09D 11/52* (2013.01); *H01B 1/22* (2013.01); *H01G 2/06* (2013.01); *H01G 4/0085* (2013.01); *H01G 4/012* (2013.01); *H01G 4/232* (2013.01); *H01G 4/248* (2013.01); *H01G 4/12* (2013.01); *H05K 1/092* (2013.01); *H05K 3/4605* (2013.01); *Y10T 29/43* (2015.01)

(58) Field of Classification Search
CPC .............. H01B 1/00; H01B 1/16; H01B 1/22; C09D 11/00; H01G 4/232; H05K 1/09; H05K 3/12; B05D 5/12
See application file for complete search history.

(56) References Cited

U.S. PATENT DOCUMENTS

2003/0214793 A1    11/2003    Uchida et al.
2007/0096061 A1    5/2007    Satou et al.
(Continued)

FOREIGN PATENT DOCUMENTS

CN    1883011 A    12/2006
CN    101354533 A    1/2009
(Continued)

OTHER PUBLICATIONS

PCT/JP2013/063861 Written Opinion dated Jun. 3, 2013.
(Continued)

*Primary Examiner* — Mark Kopec
(74) *Attorney, Agent, or Firm* — Arent Fox LLP

(57) ABSTRACT

A conductive paste that includes a (meth)acrylic resin serving as a binder resin, an organic solvent, and a metal powder. The (meth)acrylic resin has a glass transition point Tg in the range of −60° C. to 120° C., a hydroxyl group content in the range of 0.01% to 5% by weight per molecule, an acid value in the range of 1 to 50 mgKOH/g, and a weight-average molecular weight in the range of 10,000 to 350,000 Mw.

15 Claims, 1 Drawing Sheet

(51) Int. Cl.

| | | |
|---|---|---|
| *H01G 4/30* | (2006.01) | |
| *C09D 11/037* | (2014.01) | |
| *C09D 11/106* | (2014.01) | |
| *C09D 11/52* | (2014.01) | |
| *C09D 5/24* | (2006.01) | |
| *H01G 2/06* | (2006.01) | |
| *H01G 4/012* | (2006.01) | |
| *H01G 4/248* | (2006.01) | |
| *H01G 4/008* | (2006.01) | |
| *H01G 4/232* | (2006.01) | |
| *H05K 1/09* | (2006.01) | |
| *H05K 3/46* | (2006.01) | |
| *H01G 4/12* | (2006.01) | |

(56) References Cited

U.S. PATENT DOCUMENTS

| | | | | |
|---|---|---|---|---|
| 2011/0160339 A1* | 6/2011 | Jeong | ............... | C08G 59/621 523/223 |
| 2012/0080068 A1* | 4/2012 | Bae | ............... | C09J 9/02 136/244 |
| 2012/0140375 A1 | 6/2012 | Kim et al. | | |
| 2012/0302697 A1* | 11/2012 | Inada | ............... | C09D 4/00 524/561 |

FOREIGN PATENT DOCUMENTS

| | | |
|---|---|---|
| JP | 2001-307548 A | 11/2001 |
| JP | 2005-015654 A | 1/2005 |
| JP | 2006-210256 A | 8/2006 |
| JP | 2006-244845 A | 9/2006 |
| JP | 2010-135180 A | 6/2010 |
| JP | 2011-57859 A | 3/2011 |
| JP | 2011-198470 A | 10/2011 |
| KR | 20030079702 A | 10/2003 |
| KR | 20120062237 A | 6/2012 |
| TW | 200402754 | 2/2004 |
| TW | 2012-19512 | 5/2012 |

OTHER PUBLICATIONS

PCT/JP2013/063861 ISR dated Jun. 3, 2013.

\* cited by examiner

CONDUCTIVE PASTE, MULTILAYER CERAMIC ELECTRONIC COMPONENT, AND METHOD FOR MANUFACTURING SAME

CROSS REFERENCE TO RELATED APPLICATIONS

The present application is a continuation of International application No. PCT/JP2013/063861, filed May 19, 2013, which claims priority to Japanese Patent Application No. 2012-135609, filed Jun. 15, 2012, the entire contents of each of which are incorporated herein by reference.

FIELD OF THE INVENTION

The present invention relates to a conductive paste, and more particularly, relates to a conductive paste containing an acrylic or methacrylic (hereinafter referred to as "(meth) acrylic") resin. The invention is also directed to a multilayer ceramic electronic component fabricated using the conductive paste and a method for manufacturing the same.

BACKGROUND OF THE INVENTION

As a technique which is of interest to the present invention, Japanese Unexamined Patent Application Publication No. 2005-15654 (Patent Document 1) describes a technique regarding a binder resin for a conductive paste having excellent heat decomposability and adhesiveness to ceramic green sheets, and a conductive paste which does not cause cobwebbing and clogging and has an excellent printing property. More specifically, it describes a binder resin for a conductive paste, which contains a polyvinyl acetal(meth)acrylate composite resin obtained by adding a polymerizable monomer mainly composed of a (meth)acrylate to an aqueous medium in which a polyvinyl acetal resin is dispersed and causing the polymerizable monomer to permeate into the polyvinyl acetal resin, followed by polymerization, and a conductive paste which includes the binder resin for a conductive paste and a metal material.

On the other hand, Japanese Unexamined Patent Application Publication No. 2006-210256 (Patent Document 2) describes a vehicle for a coating paste, which has excellent adhesiveness, which is capable of preventing the occurrence of delamination, and which has an excellent coating property and screen printing property, and a coating paste including the same. More specifically, it describes a vehicle for a coating paste containing a modified polyvinyl acetal resin having structural units represented by specific general formulae and an organic solvent, in which the modified polyvinyl acetal resin has a flow softening point of 100° C. to 150° C., and a coating paste including the same.

However, even in the paste described in Patent Document 1 or 2, because of the presence of the composite resin including the (meth)acrylate monomer and polyvinyl acetal or the modified polyvinyl acetal resin, adhesion is low compared with the case of a simple acrylic resin whose glass transition point (Tg) can be controlled to a relatively low level. Furthermore, the resin described in Patent Document 1 is soluble only in a solvent that is likely to swell or dissolve polyvinyl butyral contained in ceramic green sheets and the like, and therefore, the resin is likely to damage ceramic green sheets.

Patent Document 1: Japanese Unexamined Patent Application Publication No. 2005-15654
Patent Document 2: Japanese Unexamined Patent Application Publication No. 2006-210256

SUMMARY OF THE INVENTION

Accordingly, it is an object of the present invention to provide a conductive paste which can secure good adhesion to ceramic green sheets.

It is another object of the present invention to provide a multilayer ceramic electronic component fabricated using the conductive paste.

It is another object of the present invention to provide a method for manufacturing a multilayer ceramic electronic component in which ceramic green sheets are unlikely to be damaged.

The present invention is first directed to a conductive paste. A conductive paste according to the present invention includes a (meth)acrylic resin serving as a binder resin, an organic solvent, and metal powder, characterized in that the (meth)acrylic resin has a glass transition point Tg in the range of −60° C. to 120° C., a hydroxyl group content in the range of 0.01% by weight to 5% by weight per molecule, an acid value in the range of 1 mgKOH/g to 50 mgKOH/g, and a weight-average molecular weight in the range of 10,000 Mw to 350,000 Mw.

(Meth)acrylic resin monomers to be used for polymerization to obtain the (meth)acrylic resin preferably include an alkyl(meth)acrylate monomer having 3 to 30 carbon atoms. As the alkyl(meth)acrylate monomer, at least one of methyl (meth)acrylate, ethyl(meth)acrylate, propyl(meth)acrylate, n-butyl(meth)acrylate, tert-butyl(meth)acrylate, isobutyl (meth)acrylate, n-hexyl(meth)acrylate, 2-ethylhexyl(meth) acrylate, isodecyl(meth)acrylate, tridecyl(meth)acrylate, and styrene is preferably used.

Furthermore, preferably, in order to provide an acid value to the (meth)acrylic resin, the carboxyl group included in at least one of acrylic acid, methacrylic acid, succinic acid, maleic acid, and itaconic acid is used.

Furthermore, (meth)acrylic resin monomers to be used for polymerization to obtain the (meth)acrylic resin preferably include a hydroxyl group-containing (meth)acrylic resin monomer. The hydroxyl group-containing (meth)acrylic resin monomer is preferably at least one of 2-hydroxymethyl (meth)acrylate, 2-hydroxyethyl(meth)acrylate, 2-hydroxypropyl(meth)acrylate, and 2-hydroxybutyl(meth)acrylate.

Preferably, the average particle size of the metal powder is in the range of 10 nm to 1,000 nm, the metal powder content is in the range of 5% by volume to 20% by volume, and the (meth)acrylic resin content is in the range of 0.5% by weight to 30% by weight.

Preferably, the metal component constituting the metal powder contains at least one of Al, Ag, Cu, Ni, Pd, Cr, Fe, and Co, or an alloy containing at least one of them.

In the conductive paste according to the present invention, the difference in solubility parameter between the (meth) acrylic resin and the organic solvent is preferably in the range of 0 $(J/cm^3)^{1/2}$ to 10 $(J/cm^3)^{1/2}$.

The present invention is also directed to a multilayer ceramic electronic component including a multilayer body which includes a plurality of stacked ceramic layers and internal electrodes disposed between the ceramic layers. The multilayer ceramic electronic component according to the present invention is characterized in that the internal electrodes includes a sintered element of the conductive paste according to the present invention.

The present invention is also directed to a method for manufacturing a multilayer ceramic electronic component. The method for manufacturing a multilayer ceramic electronic component according to the present invention includes a step of preparing the conductive paste according to the present invention, a step of preparing ceramic green sheets, a step of printing the conductive paste on the ceramic green sheets, a step of stacking the ceramic green sheets to form a green multilayer body, and a step of firing the green multilayer body, characterized in that the difference in solubility parameter between the (meth)acrylic resin and a resin included in the ceramic green sheets is in the range of 0 $(J/cm^3)^{1/2}$ to 20 $(J/cm^3)^{1/2}$.

In the conductive paste according to the present invention, the (meth)acrylic resin included therein has a glass transition point Tg in the range of −60° C. to 120° C., a hydroxyl group content in the range of 0.01% to 5% by weight per molecule, an acid value in the range of 1 to 50 mgKOH/g, and a weight-average molecular weight in the range of 10,000 to 350,000 Mw. Therefore, the surface of the coating film composed of the conductive paste can be made smooth. Thus, when a plurality of ceramic green sheets provided with the conductive paste film are stacked, the area of contact between the conductive paste film and the ceramic green sheet is increased, and as a result, adhesion can be improved. Consequently, the press bonding step can be performed at a relatively low pressure, and it is possible to suppress the occurrence of stacking displacement and structural defects.

Furthermore, in the conductive paste according to the present invention, since the hydroxyl group content is in the range of 0.01% to 5% by weight per molecule of the (meth) acrylic resin, the solubility parameter (SP value) can be controlled in a wide range. Consequently, it becomes possible to select, as the organic solvent, a solvent system that does not dissolve the resin in the ceramic green sheet.

In the method for manufacturing a multilayer ceramic electronic component according to the present invention, since the difference in solubility parameter between the (meth) acrylic resin included in the conductive paste and a resin included in the ceramic green sheets is in the range of 0 to 20 $(J/cm^3)^{1/2}$ it is possible to avoid the problem that the organic solvent included in the conductive paste dissolves the binder resin included in the ceramic green sheets. Consequently, it is possible to suppress the occurrence of stacking displacement and structural defects in the resulting multilayer body.

DETAILED DESCRIPTION OF THE PREFERRED EMBODIMENTS

Figure 1:
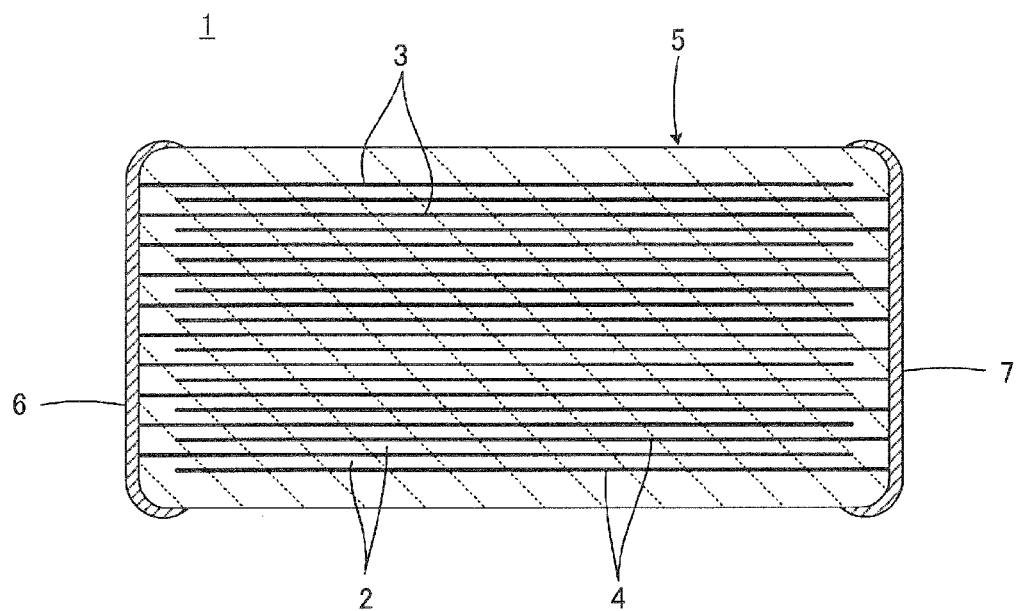
FIG. 1 is a cross-sectional view of a multilayer ceramic capacitor 1 which is an example of the multilayer ceramic electronic component fabricated using the conductive paste according to the present invention.

As shown in FIG. 1, a multilayer ceramic capacitor 1 includes a multilayer body 5 having a multilayer structure including a plurality of stacked ceramic layers 2 composed of a dielectric ceramic and first internal electrodes 3 and second internal electrodes 4 disposed between the ceramic layers 2. A first external electrode 6 and a second external electrode 7 are disposed on end portions of the multilayer body 5. The first external electrode 6 is electrically connected to the first internal electrodes 3, and the second external electrode 7 is electrically connected to the second internal electrodes 4. The first internal electrodes 3 connected to the first external electrode 6 and the second internal electrodes 4 connected to the second external electrode 7 are alternately arranged in the stacking direction.

In order to form the internal electrodes 3 and 4, a conductive paste according to the present invention is used.

The conductive paste according to the present invention, as described above, includes a (meth)acrylic resin, an organic solvent, and metal powder, characterized in that the (meth) acrylic resin has a glass transition point Tg in the range of −60° C. to 120° C., a hydroxyl group content in the range of 0.01% to 5% by weight per molecule, an acid value in the range of 1 to 50 mgKOH/g, and a weight-average molecular weight in the range of 10,000 to 350,000 Mw.

As the (meth)acrylic resin monomer to be used for polymerization to obtain the (meth)acrylic resin, for example, an alkyl(meth)acrylate monomer having 3 to 30 carbon atoms is used. More specifically, as the alkyl(meth)acrylate monomer, at least one of methyl(meth)acrylate, ethyl(meth)acrylate, propyl(meth)acrylate, n-butyl(meth)acrylate, tert-butyl (meth)acrylate, isobutyl(meth)acrylate, n-hexyl(meth)acrylate, 2-ethylhexyl(meth)acrylate, isodecyl(meth)acrylate, tridecyl(meth)acrylate, and styrene is used.

Furthermore, in order to provide an acid value to the (meth) acrylic resin, the carboxyl group included in at least one of acrylic acid, methacrylic acid, succinic acid, maleic acid, and itaconic acid is used.

Furthermore, as the (meth)acrylic resin monomer to be used for polymerization to obtain the (meth)acrylic resin, for example, a hydroxyl group-containing (meth)acrylic resin monomer is used. The hydroxyl group-containing (meth) acrylic resin monomer is preferably at least one of 2-hydroxymethyl(meth)acrylate, 2-hydroxyethyl(meth)acrylate, 2-hydroxypropyl(meth)acrylate, and 2-hydroxybutyl(meth) acrylate.

Preferably, the average particle size of the metal powder is in the range of 10 to 1,000 nm. Furthermore, preferably, the metal powder content is in the range of 5% to 20% by volume, and the (meth)acrylic resin content is in the range of 0.5% to 30% by weight.

Preferably, the metal component constituting the metal powder contains at least one of Al, Ag, Cu, Ni, Pd, Cr, Fe, and Co, or an alloy containing at least one of them.

In the conductive paste according to the present invention, the difference in solubility parameter between the (meth) acrylic resin and the organic solvent is preferably in the range of 0 to 10 $(J/cm^3)^{1/2}$.

As the organic solvent, preferably, at least one selected from the group consisting of alcohol solvents (n-octanol, n-decanol, n-dodecanol, α-terpineol, and dihydroterpineol), ether solvents (diethyl ether, dipropyl ether, diisopropyl ether, anisole, phenetole, benzyl ethyl ether, diphenyl ether, dibenzyl ether, tetrahydrofuran, ethylene glycol dimethyl ether, ethylene glycol diethyl ether, and acetal), ketone solvents (methyl propyl ketone, methyl butyl ketone, methyl pentyl ketone, diethyl ketone, methyl isobutyl ketone, diisobutyl ketone, isophorone, cyclohexanone, methylcyclohexanone, acetophenone, and camphor), and ester solvents (n-propyl acetate, butyl acetate, hexyl acetate, heptyl acetate, octyl acetate, dodecyl acetate, isopropyl acetate, isobutyl acetate, 2-ethylhexyl acetate, cyclohexyl acetate, benzyl acetate, ethyl propionate, butyl propionate, butyl butyrate, butyl stearate, butyl benzoate, benzyl benzoate, and dihydroterpineol acetate) is used.

An example of a method for manufacturing the multilayer ceramic capacitor 1 will now be described.

First, the conductive paste and a ceramic green sheet are prepared. The conductive paste is subjected to firing to form a sintered element, and then constitutes internal electrodes 3 and 24.

The ceramic green sheet is subjected to firing, and then constitutes ceramic layers 2. The ceramic green sheet is obtained by forming a slurry, which includes ceramic powder, a solvent, and an organic binder resin, into a sheet shape. Examples of the ceramic powder that can be used include barium titanate-based ceramic powder, calcium zirconate-based ceramic powder, and calcium titanate zirconate-based ceramic powder.

As the solvent, a hydrocarbon solvent, such as toluene, or an alcohol solvent can be used.

As the organic binder resin, at least one of a butyral resin, an alkyd resin, and a cellulose resin can be used. The difference in solubility parameter between the (meth)acrylic resin included in the conductive paste and the binder resin included in the ceramic green sheet is preferably set in the range of 0 to 20 $(J/cm^3)^{1/2}$. The reason for this is to avoid the problem that the organic solvent included in the conductive paste dissolves the binder resin included in the ceramic green sheet.

Next, a conductive paste film to serve as internal electrodes 3 and 4 are formed on the ceramic green sheet by printing, such as screen printing.

Next, a plurality of ceramic green sheets are stacked, subjected to press bonding, and cut into a predetermined size. Thereby, a green multilayer body is produced.

Next, the green multilayer body is subjected to firing, and thus, a multilayer body 5 shown in FIG. 1 is obtained.

Next, a conductive paste for external electrode is applied onto both end portions of the multilayer body 5, followed by baking to form external electrodes 6 and 7. The conductive paste for external electrode includes metal powder, an organic binder resin, and a solvent. As the metal powder, silver, palladium, or the like can be used. As the organic binder resin, an acrylic resin or the like can be used. As the solvent, terpineol or the like can be used.

EXPERIMENTAL EXAMPLE

An experimental example conducted to confirm advantageous effects of the present invention will be described below.

(1) Production of (meth)acrylic Resin

A (meth)acrylic resin serving as a binder resin in a conductive paste was produced as described below.

Ethyl methacrylate, 2-hydroxyethyl methacrylate, and methacrylic acid were copolymerized at a predetermined ratio in terpineol heated at 95° C. In such a manner, (meth) acrylic resins having the "Tg", "acid value", "hydroxyl group content", and "weight-average molecular weight" shown in Tables 1 and 2 were produced.

As an example, Sample 1 will be described more specifically. By copolymerizing ethyl methacrylate, 2-hydroxyethyl methacrylate, and methacrylic acid at a ratio of 90:2:8 (mol) in terpineol heated at 95° C., as shown in Table 1, a methacrylic resin of Sample 1 with a "Tg" of −60° C., an "acid value" of 10 mgKOH/g, a "hydroxyl group content" of 1% by weight, and a "weight-average molecular weight" of $10 \times 10^4$ Mw was produced.

Note that the "Tg" was measured by the method described below. That is, using a DSC (DSC2920 manufactured by TA Instruments), the temperature profile was set from −120° C. to 200° C. (20° C./min) with a measurement atmosphere of $N_2$ (30 ml/min) and an amount of measurement sample of 20 mg, the temperature profile was repeated twice for the same sample, and the "Tg" was calculated from the point of inflection of the graph of heat flow (W/g) for the second temperature.

Regarding the "acid value", a 0.01 to 1 $mol/dm^3$ ethanol mixture was subjected to neutralization with a 0.01 to 1 $mol/dm^3$ ethanol-based solution. The neutralization was terminated when a pink color was obtained. The acid value was calculated from the formula: acid value=$(5.611 \times A \times F)/S$.

In the formula, A is the amount (ml) of 0.1 $mol/dm^3$ ethanol-based solution used, F is the factor of 0.1 $mol/dm^3$ ethanol-based solution, and S is the amount (g) of sample collected.

Regarding the "weight-average molecular weight", a calibration curve was prepared using styrene or MMA as a standard solution, and measurement was performed using GPC.

(2) Preparation of Metal Powder and the Like

Metal powder composed of a metal shown under the column of "metal powder" of Table 1 or 2 and having an average particle size shown under the column of "particle size" was prepared. The "particle size" was obtained from the particle size measured by image analysis of an FE-SEM photograph taken at 20 k magnification.

Furthermore, barium titanate-based ceramic powder with an average particle size of 20 nm was prepared, the average particle size being obtained by image analysis of an FE-SEM photograph taken at 20 k magnification.

(3) Production of Conductive Paste

Next, the barium titanate-based ceramic powder was added to the metal powder, and the (meth)acrylic resin and the organic solvent were further added thereto. By performing dispersion mixing with a triple roll mill, a conductive paste was produced.

In the conductive paste, the (meth)acrylic resin was used in an amount corresponding the content shown under the column of "(meth)acrylic resin content" in Table 1 or 2, and the metal powder was used in an amount corresponding to the content shown under the column of "metal powder content" in Table 1 or 2. The ceramic powder was added in an amount of 10% by weight relative to the metal powder. The organic solvent was added in an amount five times the weight of the (meth)acrylic resin.

As an example, Sample 1 will be described more specifically. To Ni powder with an average particle size of 200 nm, 10% by weight of barium titanate-based ceramic powder with a particle size of 20 nm was added, and furthermore, 40% by weight of the (meth)acrylic resin and 10% by weight of terpineol as an organic solvent relative to 50% by weight of Ni powder were added thereto. By performing dispersion mixing with a triple roll mill, the conductive paste of Sample 1 was obtained.

In the column of "difference in SP value between solvent and (meth)acrylic resin" in Tables 1 and 2, the difference in solubility parameter (SP value) between the organic solvent and the (meth)acrylic resin in the conductive paste is shown. In addition to Sample 1, in all of Samples 2 to 31 and 33 and Samples 51 to 65, the "difference in SP value between solvent and (meth)acrylic resin" in Table 1 or 2 is 3 $(J/cm^3)^{1/2}$, and therefore, terpineol was also used as the organic solvent in Samples 2 to 31 and 33 and Samples 51 to 65 as in Sample 1. On the other hand, in Sample 32, Sample 34, and Sample 66, in which the "difference in SP value between solvent and (meth)acrylic resin" is other than 3 $(J/cm^3)^{1/2}$, an ester solvent, a ketone solvent, and an ether solvent were used, respectively, as the organic solvent.

Note that the "difference in SP value between solvent and (meth)acrylic resin" and the "difference in SP value between resins", which will be described later, are obtained as described below. First, the three-component SP value will be described. The three-component SP value is based on the idea proposed by Hansen that when the SP value is divided into three components: a dispersion force component $\delta d$, a dipolar component δp, and a hydrogen-bonding component δh, solubility can be more accurately expressed.

The SP values of the individual solvents were calculated, on the basis of the molecular structures, from the parameters given by Krevelen and Hoftyzer. Regarding the resins, the SP values can be calculated by the same method as that for the solvents, using repeating units. The solubility radius Δδ corresponding to the SP value distance between resin and solvent was calculated according to the formula below. As the solubility radius Δδ decreases, the solvent is more likely to dissolve the resin, and as the solubility radius Δδ increases, the solvent is less likely to dissolve the resin.

$$\Delta\delta=[(\delta d-\delta d')^2+(\delta p-\delta p')^2+(\delta h-\delta h')^2]^{1/2}$$

where δd, δp, and δh are SP values of the resin, and δd', δp', δh' are SP values of the solvent or the resin included in the green sheet.

(4) Fabrication of Multilayer Ceramic Capacitor

Next, a binder resin and an organic solvent including ethanol were added to barium titanate-based ceramic starting material powder, and wet mixing was carried out using a ball mill to prepare a ceramic slurry. Then, a doctor blade method was applied to the ceramic slurry, and thus, a ceramic green sheet with a thickness of 2.0 μm was formed.

In the column of "difference in SP value between resins" in Tables 1 and 2, the difference in solubility parameter (SP value) between the (meth)acrylic resin in the conductive paste and the binder resin in the ceramic green sheet is shown. In Samples 1 to 28, 32, 33, and 51 to 65, in which the "difference in SP value between resins" is 5 $(J/cm^3)^{1/2}$, a polyvinyl butyral-based binder resin was used as the binder resin. On the other hand, in Sample 29, Sample 30, Sample 31, and Sample 65, in which the "difference in SP value between resins" is other than 5 $(J/cm^3)^{1/2}$, ethyl methacrylate, methyl methacrylate, isobutyl methacrylate, and 2-ethylhexyl methacrylate were used, respectively, as the binder resin.

Next, by screen-printing the conductive paste on the ceramic green sheet, a conductive paste film with a thickness of 0.5 μm to serve as internal electrodes was formed.

Next, a plurality of ceramic green sheets provided with the conductive paste film were stacked and subjected to press bonding. Thereby, a multilayer body block including 300 internal electrode films was produced. Then, the multilayer body block was cut into a predetermined size.

Figure 2:
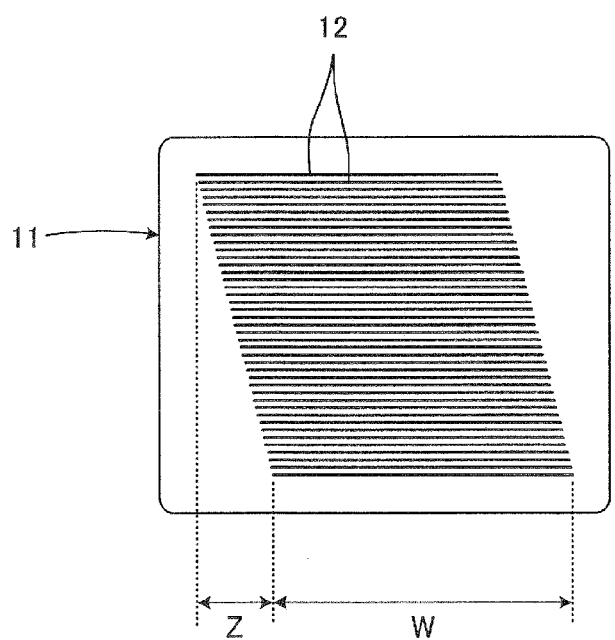
FIG. 2 is a view illustrating the stacking displacement ratio evaluated in Experimental Example.

The "stacking displacement ratio" shown in Tables 1 and 2 was evaluated. In order to evaluate the "stacking displacement ratio", as shown in FIG. 2, a cross section was taken from a green multilayer body 11, conductive paste films 12 serving as internal electrodes were exposed, and the size in the width direction W and the amount of displacement Z of the conductive paste films 12 were measured. Then, the stacking displacement ratio was determined on the basis of the formula: stacking displacement ratio=Z/W×100 [%]. In the case where the resulting value is less than 1%, the sample is evaluated as passed and indicated as "○" under the column of "stacking displacement ratio" in Table 1 or 2. In the case where the resulting value is 1% or more, the sample is evaluated as failed and indicated as "×" under the column of "stacking displacement ratio".

Next, the green multilayer body obtained by cutting was subjected to treatment for removing organic components and treatment for removing carbon. Then, the temperature was raised at a heating rate of 3° C./min or more, and firing was performed, in a reducing atmosphere, at a top temperature of 1,200° C. for 3 hours. Thereby, a sintered multilayer body serving as a main body of a component was obtained.

Next, external electrodes were formed on both end portions of the multilayer body. Thereby, a multilayer ceramic capacitor serving as a test sample was completed.

Regarding the multilayer ceramic capacitor serving as a test sample, as shown in Tables 1 and 2, the "rate of occurrence of structural defects" was evaluated. In order to evaluate the "rate of occurrence of structural defects", the percentage of test samples in which structural defects occurred among 100 test samples was checked. In the case where the resulting value is less than 10%, the sample is evaluated as passed and indicated as "○" under the column of "rate of occurrence of structural defects" in Table 1 or 2. In the case where the resulting value is 10% or more, the sample is evaluated as failed and indicated as "×" under the column of "rate of occurrence of structural defects".

Furthermore, the "green sheet resin solubility" is shown in Tables 1 and 2. The "green sheet resin solubility" was evaluated in the following manner:

(1) Into a weighing bottle (about 170 cc), 45 g of a solvent for evaluation and 5 g of a resin for evaluation were weighed.

(2) The weighing bottle of (1) was subjected to dispersion treatment at predetermined temperatures (20° C. and 70° C.) for 30 minutes using an ultrasonic cleaner and a circulator. However, regarding a solvent having a low boiling point of 80° C. or lower, dispersion treatment set at 20° C. only was performed.

(3) The dissolved state immediately after being taken out of the ultrasonic cleaner of (2) was photographed.

(4) After being left to stand for 3 days, the dissolved state was photographed again.

(5) The supernatant of the solution of (4) was collected in an amount of about 2 g, and the drying loss was measured under the conditions of 80° C. and 3 hours.

(6) The supernatant concentration was calculated according to the following formula:

Supernatant concentration [% by weight]=(weight after drying of supernatant solution)/(weight before drying of supernatant solution)

In the case where the supernatant concentration is less than 1.0% by weight, the sample is evaluated as passed and indicated as "○" under the column of "green sheet resin solubility" in Table 1 or 2. In the case where the supernatant concentration is 1.0 or more, the sample is evaluated as failed and indicated as "×" under the column of "green sheet resin solubility".

TABLE 1

| Sample No. | Tg [° C.] | Acid value [mgKOH/g] | Hydroxyl group content [wt %] | Weight-average molecular wight [× 10⁴ Mw] | Metal powder | Particle size [nm] | (Meth) acrylic resin content [wt %] | Metal powder content [vol %] | Difference in SP value between solvent and meth(acrylic resin [(J/cm³)^{1/2}] | Difference in SP value between resins [(J/cm³)^{1/2}] | Stacking displacement ratio | Rate of occurence of structural defects | Green sheet resin solubility |
|---|---|---|---|---|---|---|---|---|---|---|---|---|---|
| 1 | −60 | 10 | 1 | 10 | Ni | 200 | 5 | 10 | 3 | 5 | ○ | ○ | ○ |
| 2 | 60 | 10 | 1 | 10 | Ni | 200 | 5 | 10 | 3 | 5 | ○ | ○ | ○ |
| 3 | 120 | 10 | 1 | 10 | Ni | 200 | 5 | 10 | 3 | 5 | ○ | ○ | ○ |

TABLE 1-continued

| Sample No. | Tg [° C.] | Acid value [mgKOH/g] | Hydroxyl group content [wt %] | Weight-average molecular wight [× 10⁴ Mw] | Metal powder | Particle size [nm] | (Meth) acrylic resin content [wt %] | Metal powder content [vol %] | Difference in SP value between solvent and meth(acrylic resin [(J/cm³)^{1/2}] | Difference in SP value between resins [(J/cm³)^{1/2}] | Stacking displacement ratio | Rate of occurence of structural defects | Green sheet resin solubility |
|---|---|---|---|---|---|---|---|---|---|---|---|---|---|
| 4 | 60 | 1 | 1 | 10 | Ni | 200 | 5 | 10 | 3 | 5 | ○ | ○ | ○ |
| 5 | 60 | 10 | 1 | 10 | Ni | 200 | 5 | 10 | 3 | 5 | ○ | ○ | ○ |
| 6 | 60 | 50 | 1 | 10 | Ni | 200 | 5 | 10 | 3 | 5 | ○ | ○ | ○ |
| 7 | 60 | 10 | 0.01 | 10 | Ni | 200 | 5 | 10 | 3 | 5 | ○ | ○ | ○ |
| 8 | 60 | 10 | 1 | 10 | Ni | 200 | 5 | 10 | 3 | 5 | ○ | ○ | ○ |
| 9 | 60 | 10 | 5 | 10 | Ni | 200 | 5 | 10 | 3 | 5 | ○ | ○ | ○ |
| 10 | 60 | 10 | 1 | 1 | Ni | 200 | 5 | 10 | 3 | 5 | ○ | ○ | ○ |
| 11 | 60 | 10 | 1 | 10 | Ni | 200 | 5 | 10 | 3 | 5 | ○ | ○ | ○ |
| 12 | 60 | 10 | 1 | 35 | Ni | 200 | 5 | 10 | 3 | 5 | ○ | ○ | ○ |
| 13 | 60 | 10 | 1 | 10 | Ni | 10 | 5 | 10 | 3 | 5 | ○ | ○ | ○ |
| 14 | 60 | 10 | 1 | 10 | Ni | 200 | 5 | 10 | 3 | 5 | ○ | ○ | ○ |
| 15 | 60 | 10 | 1 | 10 | Ni | 1000 | 5 | 10 | 3 | 5 | ○ | ○ | ○ |
| 16 | 60 | 10 | 1 | 10 | Ni | 200 | 0.5 | 10 | 3 | 5 | ○ | ○ | ○ |
| 17 | 60 | 10 | 1 | 10 | Ni | 200 | 5 | 10 | 3 | 5 | ○ | ○ | ○ |
| 18 | 60 | 10 | 1 | 10 | Ni | 200 | 30 | 10 | 3 | 5 | ○ | ○ | ○ |
| 19 | 60 | 10 | 1 | 10 | Ni | 200 | 5 | 5 | 3 | 5 | ○ | ○ | ○ |
| 20 | 60 | 10 | 1 | 10 | Ni | 200 | 5 | 10 | 3 | 5 | ○ | ○ | ○ |
| 21 | 60 | 10 | 1 | 10 | Ni | 200 | 5 | 20 | 3 | 5 | ○ | ○ | ○ |
| 22 | 60 | 10 | 1 | 10 | Al | 200 | 5 | 10 | 3 | 5 | ○ | ○ | ○ |
| 23 | 60 | 10 | 1 | 10 | Ag | 200 | 5 | 10 | 3 | 5 | ○ | ○ | ○ |
| 24 | 60 | 10 | 1 | 10 | Cu | 200 | 5 | 10 | 3 | 5 | ○ | ○ | ○ |
| 25 | 60 | 10 | 1 | 10 | Pd | 200 | 5 | 10 | 3 | 5 | ○ | ○ | ○ |
| 26 | 60 | 10 | 1 | 10 | NiCr | 200 | 5 | 10 | 3 | 5 | ○ | ○ | ○ |
| 27 | 60 | 10 | 1 | 10 | NiFe | 200 | 5 | 10 | 3 | 5 | ○ | ○ | ○ |
| 28 | 60 | 10 | 1 | 10 | NiCo | 200 | 5 | 10 | 3 | 5 | ○ | ○ | ○ |
| 29 | 60 | 10 | 1 | 10 | Ni | 200 | 5 | 10 | 3 | 0 | ○ | ○ | ○ |
| 30 | 60 | 10 | 1 | 10 | Ni | 200 | 5 | 10 | 3 | 10 | ○ | ○ | ○ |
| 31 | 60 | 10 | 1 | 10 | Ni | 200 | 5 | 10 | 3 | 20 | ○ | ○ | ○ |
| 32 | 60 | 10 | 1 | 10 | Ni | 200 | 5 | 10 | 0 | 5 | ○ | ○ | ○ |
| 33 | 60 | 10 | 1 | 10 | Ni | 200 | 5 | 10 | 3 | 5 | ○ | ○ | ○ |
| 34 | 60 | 10 | 1 | 10 | Ni | 200 | 5 | 10 | 10 | 5 | ○ | ○ | ○ |

TABLE 2

| Sample No. | Tg [° C.] | Acid value [mgKOH/g] | Hydroxyl group content [wt %] | Weight-average molecular wight [× 10⁴ Mw] | Metal powder | Particle size [nm] | (Meth) acrylic resin content [wt %] | Metal powder content [vol %] | Difference in SP value between solvent and meth(acrylic resin [(J/cm³)^{1/2}] | Difference in SP value between resins [(J/cm³)^{1/2}] | Stacking displacement ratio | Rate of occurence of structural defects | Green sheet resin solubility |
|---|---|---|---|---|---|---|---|---|---|---|---|---|---|
| 51 | −100 | 10 | 1 | 10 | Ni | 200 | 5 | 10 | 3 | 5 | x | ○ | ○ |
| 52 | 140 | 10 | 1 | 10 | Ni | 200 | 5 | 10 | 3 | 5 | ○ | x | ○ |
| 53 | 60 | 0 | 1 | 10 | Ni | 200 | 5 | 10 | 3 | 5 | x | x | ○ |
| 54 | 60 | 70 | 1 | 10 | Ni | 200 | 5 | 10 | 3 | 5 | x | x | ○ |
| 55 | 60 | 10 | 0 | 10 | Ni | 200 | 5 | 10 | 3 | 5 | x | x | ○ |
| 56 | 60 | 10 | 10 | 10 | Ni | 200 | 5 | 10 | 3 | 5 | x | x | ○ |
| 57 | 60 | 10 | 1 | 0.5 | Ni | 200 | 5 | 10 | 3 | 5 | x | ○ | ○ |
| 58 | 60 | 10 | 1 | 40 | Ni | 200 | 5 | 10 | 3 | 5 | ○ | x | ○ |
| 59 | 60 | 10 | 1 | 10 | Ni | 5 | 5 | 10 | 3 | 5 | ○ | x | ○ |
| 60 | 60 | 10 | 1 | 10 | Ni | 2000 | 5 | 10 | 3 | 5 | x | ○ | ○ |
| 61 | 60 | 10 | 1 | 10 | Ni | 200 | 0.1 | 10 | 3 | 5 | ○ | x | ○ |
| 62 | 60 | 10 | 1 | 10 | Ni | 200 | 50 | 10 | 3 | 5 | x | ○ | ○ |
| 63 | 60 | 10 | 1 | 10 | Ni | 200 | 5 | 3 | 3 | 5 | ○ | ○ | x |
| 64 | 60 | 10 | 1 | 10 | Ni | 200 | 5 | 30 | 3 | 5 | x | x | ○ |
| 65 | 60 | 10 | 1 | 10 | Ni | 200 | 5 | 10 | 3 | 25 | ○ | x | ○ |
| 66 | 60 | 10 | 1 | 10 | Ni | 200 | 5 | 10 | 15 | 5 | ○ | ○ | x |

The samples shown in Table 1 are within the range of the present invention, and the samples shown in Table 2 are out of the range of the present invention or within the range of the present invention but out of the preferable range.

Examination will be made on the samples with reference to Tables 1 and 2. In Table 1, although Sample 2, Sample 5, Sample 8, Sample 11, Sample 14, Sample 17, Sample 20, and Sample 33 are the same, in order to facilitate comparison between samples in the examination, these samples are duplicated in Table 1.

<Samples 1 to 3 and Samples 51 and 52>

In Samples 1 to 3 and Samples 51 and 52, the glass transition point Tg of the (meth)acrylic resin in the conductive paste is to be noted.

In Samples 1 to 3 in which the "Tg" is in the range of −60° C. to 120° C., the "stacking displacement ratio" and "rate of occurrence of structural defects" are evaluated as passed.

In contrast, in Sample 51 in which the "Tg" is lower than −60° C., the "rate of occurrence of structural defects" is evaluated as passed, but the "stacking displacement ratio" is evaluated as failed. The reason for this is assumed that, when the "Tg" is low, although adhesion sufficient to prevent structural defects is obtained between the green sheet and the conductive paste film, the conductive paste film is likely to flow, and thus stacking displacement is likely to occur.

On the other hand, in Sample 52 in which the "Tg" is higher than 120° C., the "stacking displacement ratio" is evaluated as passed, but the "rate of occurrence of structural defects" is evaluated as failed. The reason for this is assumed that, when the "Tg" is increased, adhesion sufficient to prevent structural defects is not obtained between the green sheet and the conductive paste film, and structural defects are likely to occur, but the conductive paste film is unlikely to flow, and thus stacking displacement is unlikely to occur.

<Samples 4 to 6 and Samples 53 and 54>

In Samples 4 to 6 and Samples 53 and 54, the acid value of the (meth)acrylic resin in the conductive paste is to be noted.

In Samples 4 to 6 in which the "acid value" is 1 to 50 [mgKOH/g], the "stacking displacement ratio" and "rate of occurrence of structural defects" are evaluated as passed.

In contrast, in Sample 53 in which the "acid value" is less than 1 [mgKOH/g] and in Sample 54 in which the "acid value" is more than 50 [mgKOH/g], the "stacking displacement ratio" and "rate of occurrence of structural defects" are evaluated as failed. The reason for this is assumed that, unless the "acid value" is in the range of 1 to 50 [mgKOH/g], the viscosity suitable for printing is not obtained in the conductive paste, resulting in an increase in the surface roughness of the conductive paste film, therefore, the contact area decreases, it is not possible to obtain adhesion sufficient to prevent structural defects, and good coating film shape cannot be obtained because of bleeding, thin spots, and the like, which causes stacking displacement.

<Samples 7 to 9 and Samples 55 and 56>

In Samples 7 to 9 and Samples 55 and 56, the hydroxyl group content of the (meth)acrylic resin in the conductive paste is to be noted.

In Samples 7 to 9 in which the "hydroxyl group content" is 0.01% to 5% by weight, the "stacking displacement ratio" and "rate of occurrence of structural defects" are evaluated as passed.

In contrast, in Sample 55 in which the "hydroxyl group content" is less than 0.01% by weight and in Sample 56 in which the "hydroxyl group content" is more than 5% by weight, the "stacking displacement ratio" and "rate of occurrence of structural defects" are evaluated failed. The reason for this is assumed that, unless the "hydroxyl group content" is in the range of 0.01% to 5% by weight, as in the case of the "acid value" described above, the viscosity suitable for printing is not obtained in the conductive paste, resulting in an increase in the surface roughness of the conductive paste film, therefore, the contact area decreases, it is not possible to obtain adhesion sufficient to prevent structural defects, and good coating film shape cannot be obtained because of bleeding, thin spots, and the like, which causes stacking displacement.

<Samples 10 to 12 and Samples 57 and 58>

In Samples 10 to 12 and Samples 57 and 58, the weight-average molecular weight of the (meth)acrylic resin in the conductive paste is to be noted.

In Samples 10 to 12 in which the "weight-average molecular weight" is in the range of 1 to 35 [×10$^4$ Mw], the "stacking displacement ratio" and "rate of occurrence of structural defects" are evaluated as passed.

In contrast, in Sample 57 in which the "weight-average molecular weight" is less than 1 [×10$^4$ Mw] and in Sample 58 in which the "weight-average molecular weight" is more than 35 [×10$^4$ Mw], the "stacking displacement ratio" and "rate of occurrence of structural defects" are evaluated as failed. The reason for this is assumed that, unless the "weight-average molecular weight" is in the range of 1 to 35 [×10$^4$ Mw], as in the case of the "acid value" and "hydroxyl group content" described above, the viscosity suitable for printing is not obtained in the conductive paste, resulting in an increase in the surface roughness of the conductive paste film, therefore, the contact area decreases, it is not possible to obtain adhesion sufficient to prevent structural defects, and good coating film shape cannot be obtained because of bleeding, thin spots, and the like, which causes stacking displacement.

<Samples 13 to 15 and Samples 59 and 60>

In Samples 13 to 15 and Samples 59 and 60, the particle size of the metal powder included in the conductive paste is to be noted.

In Samples 13 to 15 in which the "particle size" is in the range of 10 to 1,000 nm, the "stacking displacement ratio" and "rate of occurrence of structural defects" are evaluated as passed.

In contrast, in Sample 59 in which the "particle size" is less than 10 nm, the "stacking displacement ratio" is evaluated as passed, but the "rate of occurrence of structural defects" is evaluated as failed. This shows that, when the "particle size" is decreased, the conductive paste film is unlikely to flow, and therefore, stacking displacement is unlikely to occur; however, since the conductive paste film is unlikely to flow, the contact area between the green sheet and the conductive paste film is not increased, and it is not possible to obtain adhesion sufficient to prevent structural defects.

On the other hand, in Sample 60 in which the "particle size" is more than 1,000 nm, the "rate of occurrence of structural defects" is evaluated as passed, but the "stacking displacement ratio" is evaluated as failed. This shows that, when the "particle size" is increased, adhesion sufficient to prevent structural defects between the green sheet and the conductive paste film can be obtained; however, since the conductive paste film is likely to flow, the stacking displacement is likely to occur.

Note that, even when the "particle size" is out of the range of 10 to 1,000 nm, by controlling the thickness of the conductive paste film, the composition of the (meth)acrylic resin in the conductive paste, and the like, the "stacking displacement ratio" and "rate of occurrence of structural defects" may be evaluated as passed. Furthermore, the conductive paste may be used in applications other than internal electrodes. Therefore, the "particle size" out of the range of 10 to 1,000 nm is also in the range of the present invention.

<Samples 16 to 18 and Samples 61 and 62>

In Samples 16 to 18 and Samples 61 and 62, the (meth) acrylic resin content in the conductive paste is to be noted.

In Samples 16 to 18 in which the "(meth)acrylic resin content" is in the range of 0.5% to 30% by weight, the "stacking displacement ratio" and "rate of occurrence of structural defects" are evaluated as passed.

In contrast, in Sample 61 in which the "(meth)acrylic resin content" is less than 0.5% by weight, since the influence of the (meth)acrylic resin decreases, the conductive paste film is less likely to flow, and therefore, the "stacking displacement ratio" is evaluated as passed. However, since the adhesion provided by the (meth)acrylic resin decreases, the "rate of occurrence of structural defects" is evaluated as failed.

On the other hand, in Sample 62 in which the "(meth) acrylic resin content" is more than 30% by weight, since the conductive paste film is likely to flow, adhesion sufficient to prevent structural defects is obtained, and the "rate of occurrence of structural defects" is evaluated as passed. However, since the conductive paste film is likely to flow, stacking displacement is likely to occur, and the "stacking displacement ratio" is evaluated as failed.

Note that, even when the "(meth)acrylic resin content" is out of the range of 0.5% to 30% by weight, by controlling the Tg of the (meth)acrylic resin in the conductive paste, the "stacking displacement ratio" and "rate of occurrence of structural defects" may be evaluated as passed. Furthermore, the conductive paste may be used in applications other than internal electrodes. Therefore, the "(meth)acrylic resin content" out of the range of 0.5% to 30% by weight is also in the range of the present invention.

<Samples 19 to 21 and Samples 63 and 64>

In Samples 19 to 21 and Samples 63 and 64, the metal powder content in the conductive paste is to be noted.

In Samples 19 to 21 in which the "metal powder content" is in the range of 5% to 20% by volume, the "stacking displacement ratio" and "rate of occurrence of structural defects" are evaluated as passed.

In contrast, in Sample 63 in which the "metal powder content" is less than 5% by volume, the solvent content in the conductive paste increases relatively, and the "green sheet resin solubility" is evaluated as failed.

On the other hand, in Sample 64 in which the "metal powder content" is more than 20% by volume, the "stacking displacement ratio" and "rate of occurrence of structural defects" are evaluated as failed. The reason for this is assumed that, when the metal powder content is large, the viscosity range suitable for printing cannot be secured, resulting in an increase in the surface roughness of the conductive paste film, therefore, the contact area with the green sheet decreases, it is not possible to obtain adhesion sufficient to prevent structural defects, and good coating film shape cannot be obtained because of bleeding, thin spots, and the like, which causes stacking displacement.

Note that, even when the "metal powder content" is out of the range of 5% to 20% by volume, by controlling the thickness of the conductive paste film, the type of organic solvent, the composition of the (meth)acrylic resin in the conductive paste, and the like, the "stacking displacement ratio" and "rate of occurrence of structural defects" may be evaluated as passed. Furthermore, the conductive paste may be used in applications other than internal electrodes. Therefore, the "metal powder content" out of the range of 5% to 20% by volume is also in the range of the present invention.

<Samples 22 to 28>

In Samples 22 to 28, the metal constituting the metal powder included in the conductive paste is to be noted.

In the samples other than Samples 22 to 28, Ni is used as the metal constituting the metal powder. In Samples 22 to 28, metals other than Ni, i.e., Al, Ag, Cu, Pd, Ni/Cr, Ni/Fe, and Ni/Co are used. In Samples 22 to 28, the "stacking displacement ratio" and "rate of occurrence of structural defects" are evaluated as passed. This shows that the effect of the (meth) acrylic resin in the conductive paste is not influenced by the type of metal constituting the metal powder.

<Samples 29 to 31 and Sample 65>

In Samples 29 to 31 and Sample 65, the difference in SP value $\delta\Delta$ between the (meth)acrylic resin in the conductive paste and the binder resin in the green sheet is to be noted.

In Samples 29 to 31 in which the "difference in SP value between resins" is in the range of 0 to 20 $[(J/cm^3)^{1/2}]$, the "stacking displacement ratio" and "rate of occurrence of structural defects" are evaluated as passed.

In contrast, in Sample 65 in which the "difference in SP value between resins" is more than 20 $[(J/cm^3)^{1/2}]$, the "rate of occurrence of structural defects" is evaluated as failed. The reason for this is assumed that adhesion resulting from compatibility between resins is decreased, and adhesion sufficient to prevent structural defects cannot be obtained between the green sheet and the conductive paste film.

Note that, even when the "difference in SP value between resins" is out of the range of 0 to 20 $[(J/cm^3)^{1/2}]$, by controlling the thickness of the conductive paste film, the type of organic solvent, and the like, the "rate of occurrence of structural defects" may be evaluated as passed. Furthermore, the conductive paste may be used in applications other than internal electrodes. Therefore, the "difference in SP value between resins" out of the range of 0 to 20 $[(J/cm^3)^{1/2}]$ is also in the range of the present invention.

<Samples 32 to 34 and Sample 66>

In Samples 32 to 34 and Sample 66, the difference in SP value $\delta\Delta$ between the solvent and the (meth)acrylic resin in the conductive paste is to be noted.

In Samples 32 to 34 in which the "difference in SP value between solvent and (meth)acrylic resin" is in the range of 0 to 10 $[(J/cm^3)^{1/2}]$, the "stacking displacement ratio" and "rate of occurrence of structural defects" are evaluated as passed, and the "green sheet resin solubility" is also evaluated as passed. The reason for this is assumed that, since the (meth) acrylic resin is likely to be dissolved in the solvent, flowing of the solvent into the green sheet is suppressed, and as a result, the binder resin in the green sheet is less likely to be dissolved.

In contrast, in Sample 66 in which the "difference in SP value between solvent and (meth)acrylic resin" is more than 10 $[(J/cm^3)^{1/2}]$, the "green sheet resin solubility" is evaluated as failed. The reason for this is assumed that, since the (meth) acrylic resin cannot hold the solvent, the solvent flows toward the green sheet and dissolves the binder resin in the green sheet.

Note that, even when the "difference in SP value between solvent and (meth)acrylic resin" is out of the range of 0 to 10 $[(J/cm^3)^{1/2}]$, by controlling the resin content in the green sheet, the "green sheet resin solubility" may be evaluated as passed. Furthermore, the conductive paste may be used in applications other than internal electrodes. Therefore, the "difference in SP value between solvent and (meth)acrylic resin" out of the range of 0 to 10 $[(J/cm^3)^{1/2}]$ is also in the range of the present invention.

REFERENCE SIGNS LIST 1 multilayer ceramic capacitor
2 ceramic layer
3, 4 internal electrode
5 multilayer body
11 green multilayer body
12 conductive paste film

The invention claimed is:
1. A conductive paste comprising:
a (meth)acrylic resin serving as a binder resin;
an organic solvent; and
a metal powder,
wherein the (meth)acrylic resin has:
a glass transition point Tg of −60° C. to 120° C.,
a hydroxyl group content of 0.01% by weight to 5% by weight per molecule, an acid value of 1 mgKOH/g to 50 mgKOH/g,
a weight-average molecular weight of 10,000 Mw to 350,000 Mw, and
an average particle size of the metal powder is 10 nm to 1,000 nm,
the metal powder is 5% by volume to 20% by volume of the conductive paste, and
the (meth)acrylic resin is 0.5% by weight to 30% by weight of the conductive paste.

2. The conductive paste according to claim 1, wherein (meth)acrylic resin monomers used for polymerization to obtain the (meth)acrylic resin include alkyl (meth)acrylate monomers having 3 to 30 carbon atoms.

3. The conductive paste according to claim 2, wherein the alkyl (meth)acrylate monomers are selected from the group consisting of at least one of methyl (meth)acrylate, ethyl (meth)acrylate, propyl (meth)acrylate, n-butyl (meth)acrylate, tert-butyl (meth)acrylate, isobutyl (meth)acrylate, n-hexyl (meth)acrylate, 2-ethylhexyl (meth)acrylate, isodecyl (meth)acrylate, tridecyl (meth)acrylate, and styrene.

4. The conductive paste according to claim 1, wherein the acid value is provided to the (meth)acrylic resin by a carboxyl group included in at least one of acrylic acid, methacrylic acid, succinic acid, maleic acid, and itaconic acid.

5. The conductive paste according to claim 1, wherein (meth)acrylic resin monomers used for polymerization to obtain the (meth)acrylic resin include hydroxyl group-containing (meth)acrylic resin monomers.

6. The conductive paste according to claim 5, wherein the hydroxyl group-containing (meth)acrylic resin monomers are selected from the group consisting of at least one of 2-hydroxymethyl (meth)acrylate, 2-hydroxyethyl (meth)acrylate, 2-hydroxypropyl (meth)acrylate, and 2-hydroxybutyl (meth)acrylate.

7. The conductive paste according to claim 1, wherein a metal component constituting the metal powder contains at least one of Al, Ag, Cu, Ni, Pd, Cr, Fe, Co, and alloys thereof.

8. The conductive paste according to claim 1, wherein a difference in solubility between the (meth)acrylic resin and the organic solvent is in a range of 0 $(J/cm^3)^{1/2}$ to 10 $(J/cm^3)^{1/2}$.

9. The conductive paste according to claim 1, wherein the organic solvent is at least one selected from the group consisting of alcohol solvents, ether solvents, ketone solvents, and ester solvents.

10. A multilayer ceramic electronic component comprising a multilayer body which includes a plurality of stacked ceramic layers and internal electrodes disposed between the ceramic layers, wherein the internal electrodes includes a sintered element of the conductive paste according to claim 1.

11. A method for manufacturing a multilayer ceramic electronic component, the method comprising:
preparing the conductive paste according to claim 1;
preparing ceramic green sheets;
printing the conductive paste on the ceramic green sheets;
stacking the ceramic green sheets to form a green multilayer body; and
firing the green multilayer body,
wherein a difference in solubility between the (meth)acrylic resin and a resin included in the ceramic green sheets is in a range of 0 $(J/cm^3)^{1/2}$ to 20 $(J/cm^3)^{1/2}$.

12. The method for manufacturing a multilayer ceramic electronic component according to claim 11, wherein (meth)acrylic resin monomers used for polymerization to obtain the (meth)acrylic resin include alkyl (meth)acrylate monomers having 3 to 30 carbon atoms.

13. The method for manufacturing a multilayer ceramic electronic component according to claim 11, wherein the acid value is provided to the (meth)acrylic resin by a carboxyl group included in at least one of acrylic acid, methacrylic acid, succinic acid, maleic acid, and itaconic acid.

14. The method for manufacturing a multilayer ceramic electronic component according to claim 11, wherein (meth)acrylic resin monomers used for polymerization to obtain the (meth)acrylic resin include hydroxyl group-containing (meth)acrylic resin monomers.

15. The method for manufacturing a multilayer ceramic electronic component according to claim 11, wherein a metal component constituting the metal powder contains at least one of Al, Ag, Cu, Ni, Pd, Cr, Fe, Co, and alloys thereof.

* * * * *